United States Patent
Bahl et al.

(10) Patent No.: US 8,527,824 B2
(45) Date of Patent: Sep. 3, 2013

(54) TESTING OF MULTI-CLOCK DOMAINS

(71) Applicant: STMicroelectronics International N.V., Amsterdam (NL)

(72) Inventors: Swapnil Bahl, Greater Noida (IN); Akhil Garg, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 13/739,799

(22) Filed: Jan. 11, 2013

(65) Prior Publication Data

US 2013/0159802 A1    Jun. 20, 2013

Related U.S. Application Data

(62) Division of application No. 12/821,038, filed on Jun. 22, 2010, now Pat. No. 8,381,051.

(30) Foreign Application Priority Data

Apr. 23, 2010 (IN) .............................. 981/DEL/2010

(51) Int. Cl.
*G01R 31/3177*    (2006.01)
*G01R 31/40*    (2006.01)

(52) U.S. Cl.
USPC ........................................... 714/729; 714/738

(58) Field of Classification Search
None
See application file for complete search history.

(56) References Cited

U.S. PATENT DOCUMENTS

| | | | |
|---|---|---|---|
| 6,671,839 B1 | 12/2003 | Cote et al. | |
| 2003/0115524 A1* | 6/2003 | Johnston et al. | 714/726 |
| 2005/0276321 A1 | 12/2005 | Konuk | |
| 2006/0107145 A1* | 5/2006 | Athavale et al. | 714/727 |

* cited by examiner

*Primary Examiner* — Ajay Bhatia
*Assistant Examiner* — Dipakkumar Gandhi
(74) *Attorney, Agent, or Firm* — Hogan Lovells US LLP (57) ABSTRACT

A system for testing multi-clock domains in an integrated circuit (IC) includes a plurality of clock sources coupled to a plurality of clock controllers. Each of the clock sources generates a fast clock associated with one of the multi-clock domains. Each of the clock controllers is configured to provide capture pulses to test one clock domain. The capture pulses provided to a clock domain are at a frequency of a fast clock associated with the clock domain. The clock controllers operate sequentially to provide the capture pulses to test the clock domains.

5 Claims, 7 Drawing Sheets

TESTING OF MULTI-CLOCK DOMAINS

RELATED APPLICATION

The present invention is a divisional of U.S. patent application Ser. No. 12/821,038 filed Jun. 22, 2010, which claims the benefit of India Patent Application No. 981/DEL/2010 filed Apr. 23, 2010, both of which are incorporated herein by reference in their entireties.

FIELD OF THE INVENTION

The present invention relates to testing of integrated circuits, and in particular, relates to testing of multi-clock domains.

BACKGROUND

With the advent of sub-micron technology, integrated circuits (ICs) are becoming increasingly dense making them suitable for low power and low cost applications. Such ICs are typically tested using Automatic Test Pattern Generation (ATPG) tools, which simulate the overall functionality of an IC and generate test patterns, also referred to as test vectors. Various types of test patterns are provided for testing faults, such as, stuck-at faults, transition faults, and path-delay faults.

During testing, the number of test patterns and execution time of testing are tracked to minimize the overall cost of testing. The goal for any ATPG tool is to achieve the maximum test coverage with minimum number of test patterns. As a result, the nature of the test patterns may be such that the switching activity in the IC may be more than a specified power budget, for example, the switching activity may be 10% or more of the total possible switching per clock pulse. This can result in false failures and in some cases affect product reliability or cause permanent damage to the IC.

Controlling the switching activity during testing to stay within the specified power budget is desired for any low-power ATPG tool. Therefore, the low-power ATPG tools deterministically generate the test patterns to keep the switching activity below the specified power budget. For example, the ATPG tools target a limited number and limited types of faults such that the number of memory elements toggling, i.e. the switching activity, in response to a test pattern does not exceed the specified power budget.

The above mentioned methodology works well for ICs having a single clock domain or a plurality of clock domains whose clocks are derived from a single clock source. However, multiple clock domains, i.e., logic circuits operating at different clock frequencies, often exist within a single IC. The ATPG tools generally assign a combined power budget for all the clock domains. This translates into lesser flexibility in choosing the test patterns and reduced test coverage. Additionally, even though the ATPG tools may theoretically satisfy the power budget requirements for all the clock domains, the ATPG tools inaccurately report the switching activity for an individual clock domain.

SUMMARY

This summary is provided to introduce concepts related to testing of multi-clock domains of an integrated circuit (IC), which are further described below in the detailed description. This summary is not intended to identify essential features of the claimed subject matter nor is it intended for use in determining or limiting the scope of the claimed subject matter.

In one embodiment, the method includes providing capture pulses at a frequency of a first fast clock to test a first clock domain of the IC. The capture pulses at the first fast clock are provided based on a scan enable signal. The capture pulses launch and capture the response of the first clock domain to a test pattern. A second clock domain of the IC is then provided with capture pulses at a frequency of a second fast clock. The capture pulses at the second fast clock are provided based on a delayed scan enable signal. In an implementation, the second clock domain is provided with the capture pulses at the second fast clock after the first clock domain has been tested.

BRIEF DESCRIPTION OF THE DRAWINGS

The detailed description is provided with reference to the accompanying figures. In the figures, the left-most digit(s) of a reference number identifies the figure in which the reference number first appears. The same numbers are used throughout the drawings to reference like features and components. For simplicity and clarity of illustration, elements in the figures are not necessarily to scale.

DETAILED DESCRIPTION OF PREFERRED EMBODIMENTS

The disclosed subject matter relates to testing of multiple clock domains in integrated circuits (ICs). Generally, automatic test pattern generation (ATPG) tools are used to test both single and multi-clock domains to detect various kinds of faults, such as transition faults, stuck-at faults, and path-delay faults.

ICs are typically tested based on scan testing. Scan testing includes configuring memory elements, such as flip-flops and latches, of an IC into scan cells and then stitching them together to form scan chains. Further, the scan testing includes operating the IC in two modes: shift mode and capture mode. In the shift mode, a test pattern is shifted into the scan chains with the help of a number of shift pulses. The IC generally includes a clock controller to provide the shift pulses to the scan chains. Typically, shifting is done at a slow frequency to avoid high power dissipation.

Once the test pattern is shifted into the scan chains, the capture mode can start. In the capture mode, at least two capture pulses are applied to capture the response of the scan chains to the test pattern. The clock controller in the IC provides the capture pulses to the scan chains in the capture mode. To detect timing-related faults, such as transition faults and path-delay faults, at-speed testing is performed in the capture mode, which means that the capture pulses applied are at the system frequency. The first capture pulse launches a test pattern, while the second capture pulse captures the response of the scan chains to the test pattern.

Further, at-speed testing helps to achieve better test coverage of ICs. On-chip clock sources, such as Phase Locked Loops (PLLs) and Oscillators, are used to generate capture pulses at the system frequencies. At the end of the capture mode, the test pattern is unloaded or shifted out from the IC and is compared with an expected response. Based on the difference in the captured response and the expected response, faulty elements in the scan chains can be identified.

In an IC having multiple clock domains, as each clock domain operates on a different frequency, the IC includes a number of on-chip sources that generate capture pulses for each clock domain at their associated clock frequency. Thus, performing at-speed testing for such an IC involves providing capture pulses to each clock domain at the associated frequency.

However, it has been observed that during scan testing for such an IC, specifically in the capture mode, the switching activity increases well beyond that of a specified power budget. While power budget of an IC defines the number of memory elements that can toggle at a capture pulse without violating the power specifications, the switching activity of the IC defines the number of memory elements, for example, flip-flops and latches, which are actually toggling at the capture pulse. As the clock domains of the IC are tested on capture pulses of different frequencies, the switching activity of the IC per capture pulse would give erroneous results.

Further, as a result of increased switching activity, the energy, peak power and average power consumption of the IC also goes up and the reliability of the IC cannot be guaranteed. Such power-related issues become even more prominent in view of continuous shrinking of dimensions of memory elements. It has also been observed that the ATPG tools fail to correctly capture the switching activity within each clock domain.

The embodiments described herein will help address the aforementioned issues in addition to providing several other advantages over the existing testing schemes for multi-clock domains.

In one embodiment, clock controllers of an IC operate one at a time in a sequential manner to provide the capture pulses to associated clock domains in the scan chains. The capture pulses to a clock domain are at the frequency at which the clock domain operates. The operation of the clock controllers can be based on a scan enable signal. When the scan enable signal is at logic high, the clock controllers provide a number of shift pulses to the multiple clock domains in the scan chains based on which a test pattern is loaded on the scan chains. On the other hand, when the scan enable signal is low, the clock controllers sequentially provide the capture pulses of different frequencies to the corresponding clock domains in the scan chains. The test pattern is launched and captured from the scan chains based on the capture pulses. Further, the test pattern can be shifted out and compared with an expected response to identify faulty elements in the scan chains. As the clock domains are tested sequentially, a single test pattern can be used to achieve the power budget for individual clock domains.

For example, a first clock controller receives the scan enable signal. Based on whether the scan enable signal is logic high or logic low, the first clock controller is configured to provide either shift pulses in the shift mode or capture pulses in the capture mode to an associated clock domain. Once the first clock controller provides capture pulses to the associated clock domain, a second clock controller is activated after a pre-determined delay. In said embodiment, the first clock controller provides a delayed scan enable signal to the following clock controller after the first clock controller has sent the capture pulses to the clock domain.

In another embodiment, individual scan enable signals are provided to each of the clock controllers such that no two clock controllers get pulsed concurrently in the capture mode. In yet another embodiment, a predetermined number of clock pulses lapse after the first clock controller has provided the capture pulses and before the second clock controller may be activated. Such a determination is made based on chain bits provided to the first clock controller.

The present subject matter described herein tests multiple clock domains using a single test pattern by masking cross clock domain paths. In addition, the capture pulses are provided to those clock domains in the scan chain that are being tested by a given test pattern. The reduction in the number of test patterns greatly reduces the cost and time taken during the testing. Also, at-speed sequential pulsing of the multi-clock domains helps to define a power budget for each clock domain independently. In addition, by setting up a timing relationship between different controllers, it is now possible for an ATPG tool to accurately predict the switching activity.

While aspects of described systems and methods for testing the multi-clock domains can be implemented in any number of different configurations, the embodiments are described in the context of the following exemplary system architecture(s). Additionally, the word "connected" is used throughout for clarity of the description and can include either a direct connection or an indirect connection. The descriptions and details of well-known components are omitted for simplicity of the description. Although the devices are explained herein as certain shift registers and flip-flops, it can be appreciated that devices having similar functionalities may be implemented in accordance with the present subject matter.

Accordingly, the logic level of control signals can either be active low or active high. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action.

Figure 1A:
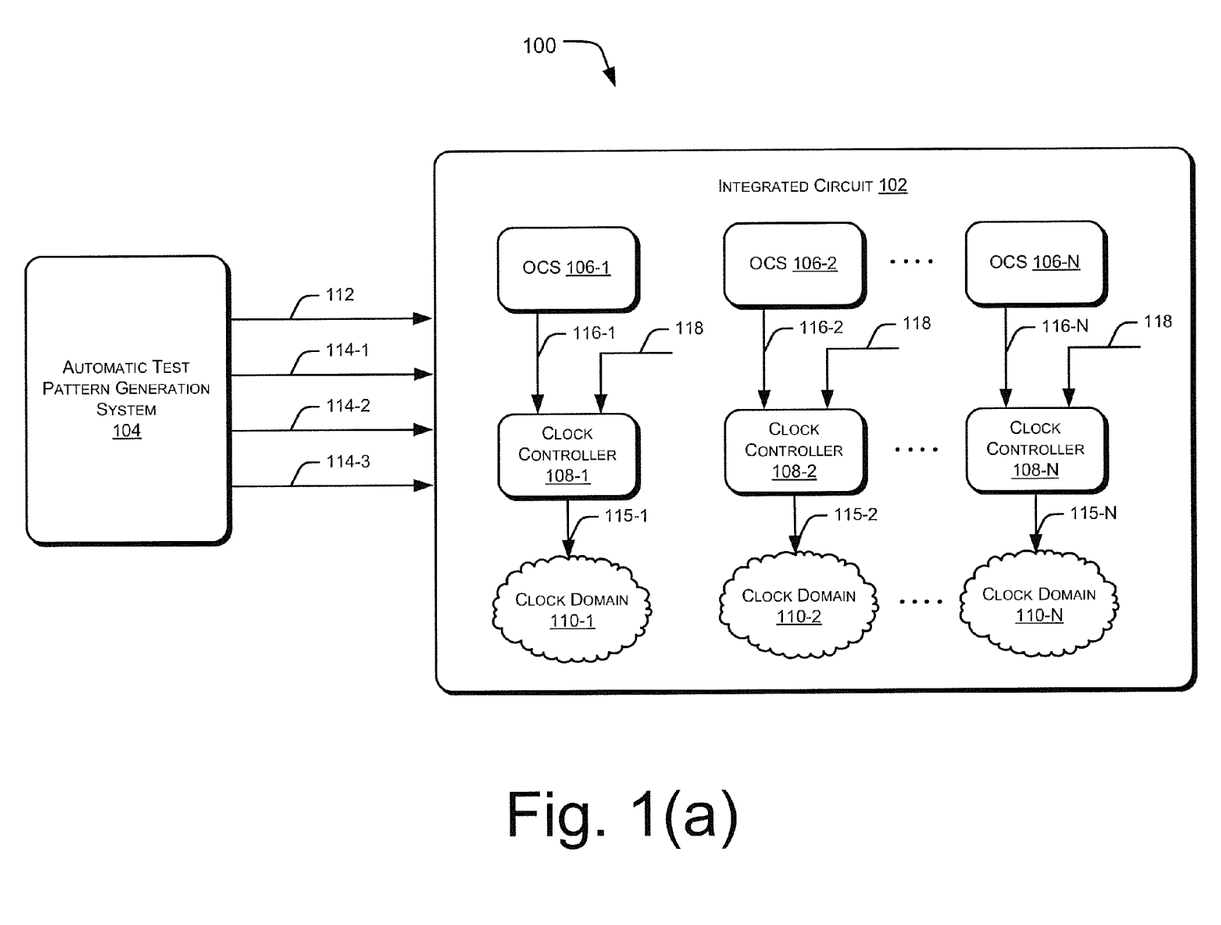
FIG. 1(a) illustrates an exemplary system for scan testing an integrated circuit (IC) using an ATPG system, in accordance with an embodiment of the present subject matter.

FIG. 1(a) illustrates an exemplary system 100 for scan testing an integrated circuit (IC) 102 using an ATPG system 104. In one embodiment, the IC 102 includes a plurality of on-chip clock sources (OCS) associated with a plurality of clock controllers, for example, a first OCS 106-1, a second OCS 106-2, and so on till an $n^{th}$ OCS 106-N (collectively referred to as OCS 106) associated with a first clock controller 108-1, a second clock controller 108-2, and so on till an $n^{th}$ clock controller 108-N (collectively referred to as clock controllers 108) respectively. In an implementation, one or more clock controllers 108 can be coupled to an OCS 106. For example, the clock controllers 108 can be coupled to one OCS, for example the OCS 106-1 through divider circuits. The divider circuits are configured to generate clock signals of different frequencies for the clock controllers 108. The OCS 106 may be implemented using phase locked loops and oscillators. Each of the clock controllers 108 is associated with a clock domain within the IC 102. For example, the first clock controller 108-1 is associated with a first clock domain 110-1 working at a particular frequency, say 200 megahertz (MHz). Similarly, the second clock controller 108-2 is associated with a second clock domain 110-2 operating at 150 MHz frequency. The first clock domain 110-1, the second clock domain 110-2, and so on till an $n^{th}$ clock domain 110-N, will be hereinafter collectively referred to as clock domains 110.

The ATPG system 104 provides test vectors or test patterns 112 for testing the multi-clock domains, for example the clock domains 110. The test patterns 112 are generated based on the faults to be detected and the power budget for the clock domains 110. The power budget can be defined for the IC 102 or the individual clock domains 110. For example, for testing a first clock domain 110-1, a power budget of 10% is defined. The ATPG system 104 also includes a control bus to test various clock domains 110. In one example, the control bus includes a plurality of control signals, for example, a test mode signal 114-1, a scan enable signal 114-2, and a sequential capture signal 114-3.

When the test mode signal 114-1 is logic low, the IC 102 works in the normal or functional mode. However, when the test mode signal 114-1 is logic high, scan testing of the IC 102 can be performed. The scan testing includes operating the IC 102 in two modes: a shift mode and a capture mode. The IC 102 is made to switch between the shift and the capture modes based on whether the scan enable signal 114-2 is logic high or low.

The scan enable signal 114-2 is a select signal for the clock controllers 108, which are configured to multiplex between capture pulses in the capture mode and shift pulses in the shift mode. The clock controllers 108 thus provide first clock signals (FCLKs) 115 to their associated clock domains 110. The FCLKs 115 includes both the capture pulses and the shift pulses. For example, the first clock controller 108-1 provides FCLK 115-1 for testing the first clock domain 110-1, and so on.

When the scan enable signal 114-2 is logic high, the clock controllers 108 obtain the shift pulses. In an implementation, shift pulses at a low frequency, also referred to as slow clock 118, can be obtained from an external source. The external source may be as an automatic test equipment (not shown in the figure). The shift pulses at the slow clock 118 are provided by the clock controllers 108 as the FCLKs 115 to the clock domains 110. The ATPG 104 provides the test pattern 112 for testing the clock domains 110. For example, the first clock controller 108-1 provides the shift pulses at the slow clock 118 as the FCLK 115-1 to the first clock domain 110-1. The test pattern 112 is provided to the clock domains 110 for testing.

When the scan enable signal 114-2 is logic low, at least two capture pulses at system frequencies, also referred to as fast clocks 116, are obtained from the OCSs 106. The clock controllers 108 then transfer the capture pulses at the fast clocks 116 as the FCLKs 115 to their associated clock domains 110. Upon receiving the capture pulses, each of the clock domains 110 is tested based on the test pattern 112. One or more capture pulses launch the test pattern 112 on the clock domains 110, while the other capture pulses obtain the response of the clock domains 110 to the test pattern 112.

For example, the first OCS 106-1 provides the capture pulses at a fast clock 116-1 to the first clock controller 108-1. The first clock controller 108-1 provides the capture pulses at the fast clock 116-1 to the first clock domain 110-1. The capture pulses launch and capture the response of the test pattern 112 provided to the first clock domain 110-1. Subsequently, the second OCS 106-2 provides capture pulses at a fast clock 116-2 to the second clock controller 108-2, which then provides the capture pulses at the fast clock 116-2 to the second clock domain 110-2 for testing.

In one implementation, the sequential capture signal 114-3 configures the system 100 to work in parallel or sequential mode. When the sequential capture signal 114-3 is logic low, each of the clock domains 110 are tested in parallel. The parallel mode of testing can involve disabling or masking all cross clock domain paths. Accordingly, the ATPG system 104 generates the test pattern 112 to be applied to test all the clock domains 110. The scan enable signal 114-2 is provided to all the clock controllers 108 in parallel and thus, the clock controllers 108 provide the FCLKs 115 for each of the clock domains 110. As a result, all the clock domains 110 can be tested in parallel.

However, when the sequential capture signal 114-3 is high, no two clock controllers 108 are pulsed at the same time in the capture mode. For example, the first clock controller 108-1 and the second clock controller 108-2 may be pulsed sequentially, i.e., the second clock controller 108-2 may be pulsed after the first clock controller 108-1 has provided the capture pulses, as explained above. Such a sequential pulsing helps in defining a timing relationship amongst the clock controllers 108.

Figure 1B:
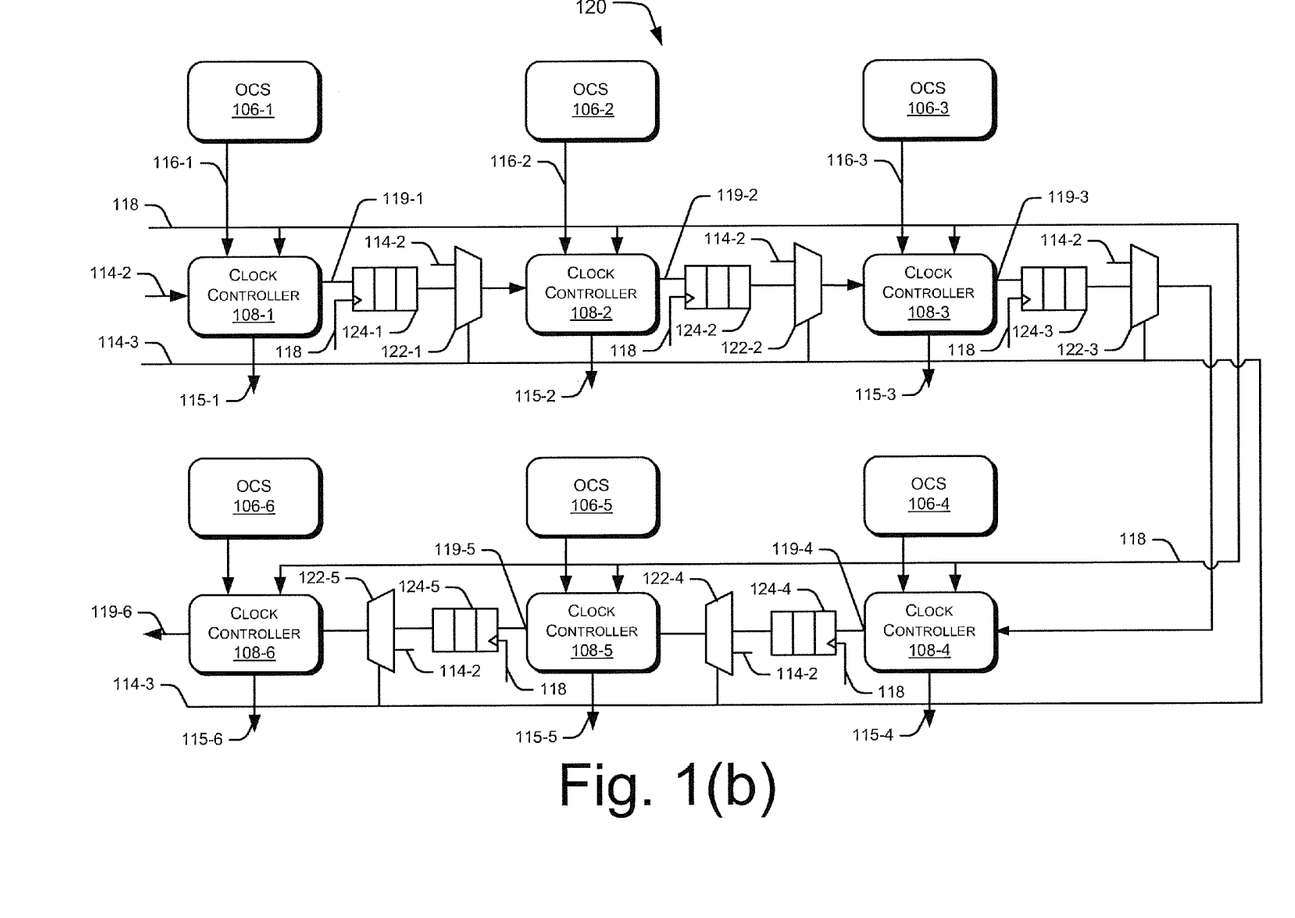
FIG. 1(b) illustrates an exemplary architecture of clock controllers and on-chip clock sources, in accordance with an embodiment of the present subject matter.
Figure 1C:
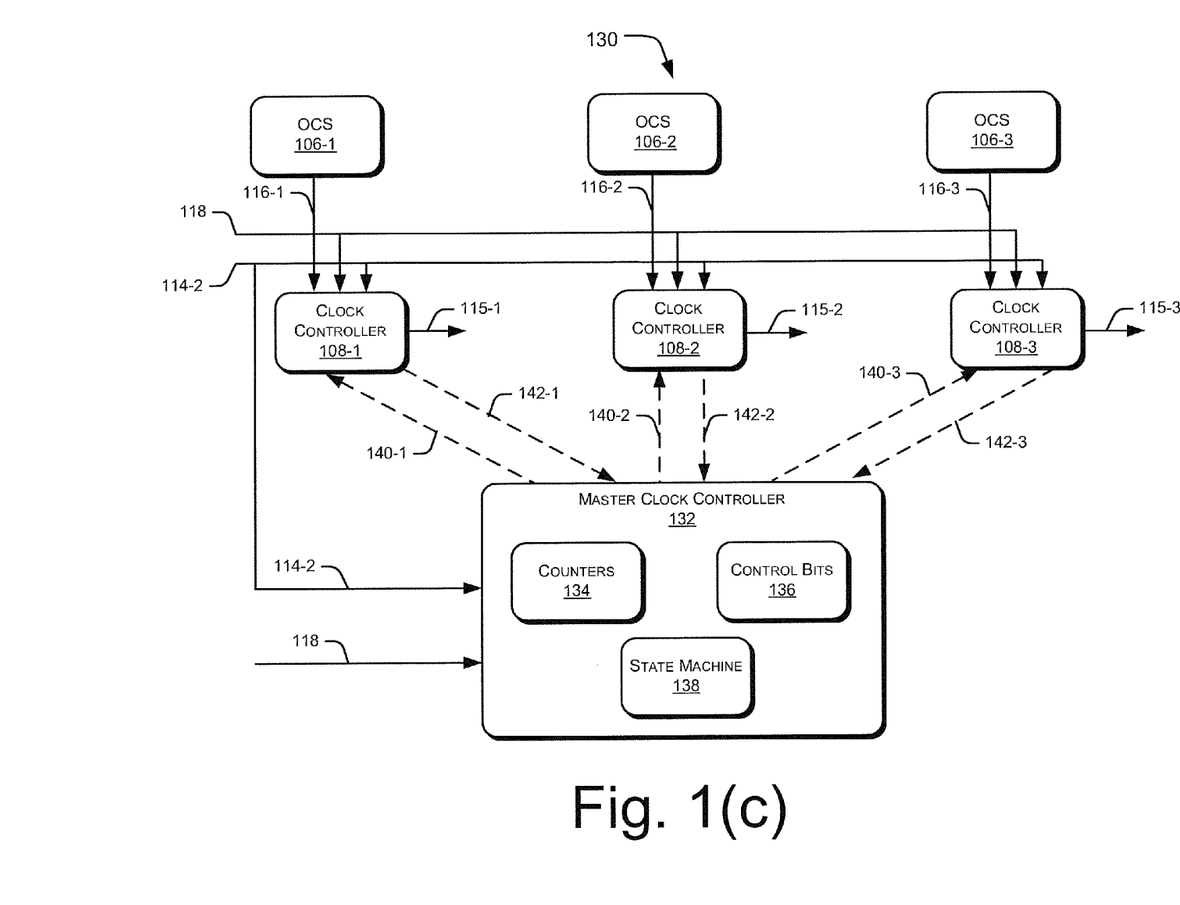
FIG. 1(c) illustrates an exemplary architecture of the clock controllers and the on-chip clock sources, in accordance with another embodiment of the present subject matter.

To this end, exemplary embodiments have been illustrated in FIG. 1(b) and FIG. 1(c). However, more embodiments may be possible as will be apparent to a person skilled in the art. Additionally, while the present subject matter has been illustrated with only two clock controllers 108, it is to be understood that the concept is readily extensible and scalable to ICs having more than two clock domains 110 and more than two fast clocks 116.

FIG. 1(b) illustrates a daisy chain architecture 120 of the clock controllers 108, in accordance with an embodiment of the present subject matter. Referring to FIG. 1(b), sequential pulsing of the clock controllers 108 in the capture mode is achieved by arranging the clock controllers 108 in the daisy chain architecture 120. In one embodiment, the first clock signal FCLK 115-1 from the first clock controller 108-1 is fed to the corresponding clock domain, i.e., the first clock domain 110-1.

In one embodiment, a second clock signal (SCLK) 119-1 of the first clock controller 108-1 is fed as an enable signal to the following clock controller, for example, the second clock controller 108-2. In other words, the scan enable signal 114-2 traverses from the first clock controller 108-1 to the second clock controller 108-2 after the first clock controller 108-1 has provided the capture pulses to the first clock domain 110-1.

As mentioned before, the clock controllers 108 may be pulsed either in parallel or in sequence. Such a design is possible with the help of the sequential capture signal 114-3 provided to multiplexers 122-1, 122-2, . . . , 122-5. When the sequential capture signal 114-3 is logic low, the clock controllers 108 work in a parallel fashion as described with reference to FIG. 1(a). However, when the sequential capture signal 114-3 is logic high, the first clock controller 108-1 synchronizes with a negative edge of the scan enable signal 114-2 and provides two capture pulses to the first clock domain 110-1. In other words, the first clock controller 108-1 provides the capture pulses when the scan enable signal is at logic low. Once the capture pulses are provided to the first clock domain 110-1, a delayed scan enable signal, i.e., SCLK 119-1 is used to enable the second clock controller 108-2. Subsequently, after the capture pulses are provided to the second clock domain 110-2, the second clock controller 108-2 triggers the next clock controller in line, e.g., a third clock controller 108-3 using a SCLK 119-2, and so on. In an implementation, the delayed scan enable signal SCLK 119-1 is delayed by a time duration of the capture pulses provided to the first clock domain 110-1.

This sort of chained architecture results in setting a timing relationship between different clock controllers 108. Also, in the daisy chain architecture 120, since any two clock controllers 108 are pulsing at different frequencies, synchronizers, such as shift registers 124-1, 124-2, . . . , 124-5 (collectively referred to as shift registers 124) may be included to deal with meta-stability issues. For example, the shift register 124-1 is placed between the first clock controller 108-1 and the second clock controller 108-2. In one embodiment, the shift registers 124 are clocked by the slow clock 118.

FIG. 1(*c*) illustrates the clock controllers 108 and arranged in a master-slave architecture 130, in accordance with an embodiment of the present subject matter. In said embodiment, one controller is a master clock controller 132. The master clock controller 132 includes counters 134, control bits 136, and a state machine 138 for keeping an account of the number of slave clock controllers, for example, the clock controllers 108, which are to be operated.

The master clock controller 132 receives the slow clock 118 and the scan enable signal 114-2 to generate start signals 140 including start signals 140-1, 140-2, and 140-3 and finish signals 142 including finish signals 142-1, 142-2, and 142-3. For example, the master clock controller 132 first sends the start signal 140-1 to a corresponding clock controller, for example the first clock controller 108-1. The start signal 140-1 allows the first clock controller 108-1 to work in either the shift mode or the capture mode based on whether the scan enable signal 114-2 is logic high or logic low. At the end of the capture mode, the first clock controller 108-1 provides the finish signal 142-1 to the master clock controller 132, indicating that the master clock controller 132 may now send subsequent start signals 140 to subsequent clock controllers waiting to be operated. In another embodiment, a user may indicate the number of clock controllers 108 to be operated. Further, the user may also provide other parameters, such as number of capture pulses to be generated in the capture mode.

In another embodiment, multiple scan enable signals may be applied to each of the clock controllers 108. Each of the scan enable signals applied to the clock controllers 108 may be sequentially enabled. The enabling can be controlled both internally and externally by a user.

Figure 2:
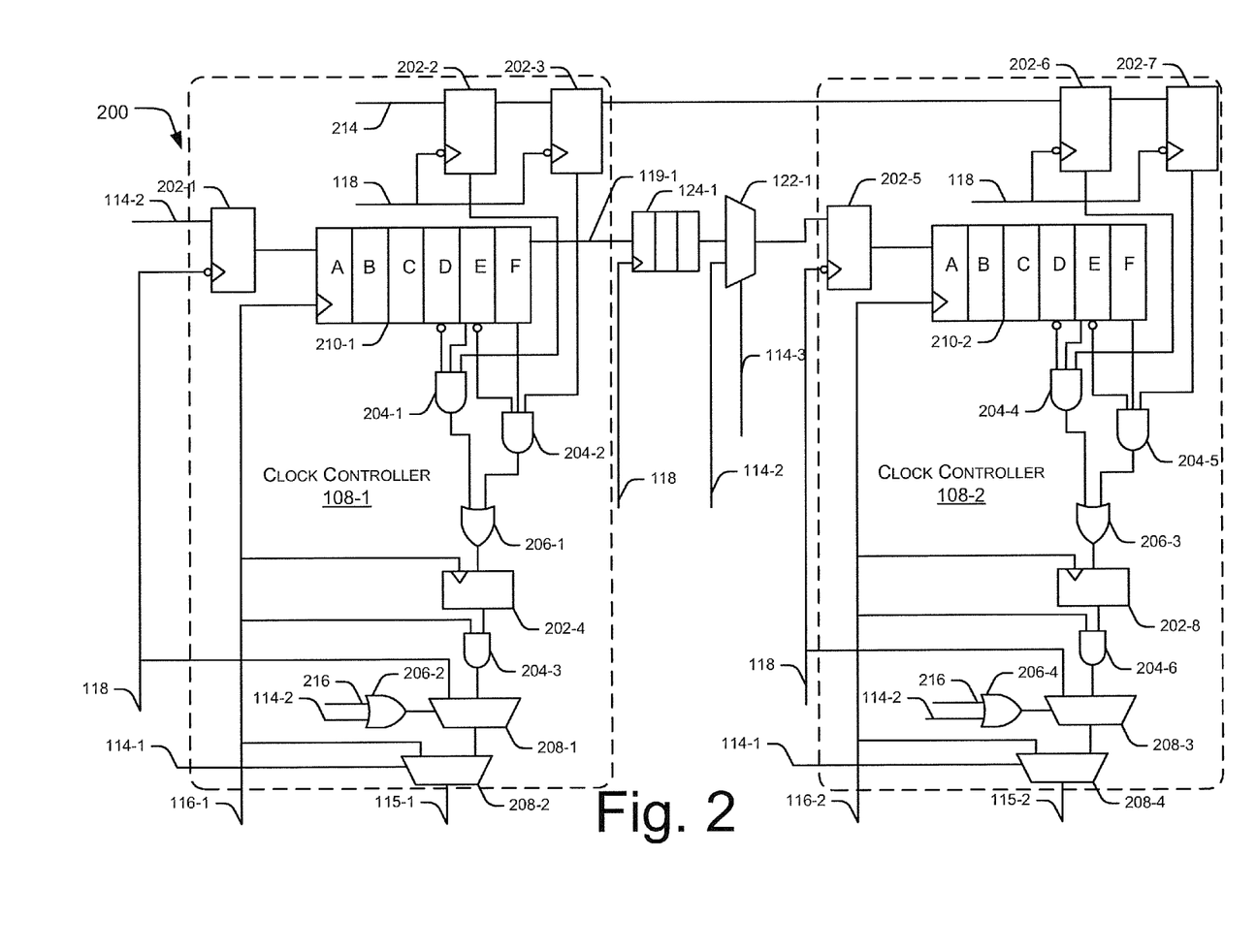
FIG. 2 illustrates a detailed architecture of two clock controllers, in accordance with yet another embodiment of the present subject matter.

FIG. 2 illustrates an exemplary architecture 200 of the clock controllers 108, in accordance with yet another embodiment of the present subject matter.

In said embodiment, each of the clock controllers 108 includes logic gates, shift registers, multiplexers, and flip-flops. For example, the first clock controller 108-1 includes flip flops 202-1, . . . , 202-4, AND gates 204-1, 204-2, and 204-3, OR gates 206-1 and 206-2, multiplexers 208-1 and 208-2, and a shift register 210-1. Similarly, the second clock controller 108-2 includes flip flops 202-5, . . . , 202-8, AND gates 204-4, 204-5, and 204-6, OR gates 206-3 and 206-4, multiplexers 208-3 and 208-4, and a shift register 210-2. A synchronizer, such as the shift register 124-1, is implemented between the first clock controller 108-1 and the second clock controller 108-2. Also, the multiplexer 122-1 placed between the shift register 124-1 and the second clock controller 108-2 configures the clock controllers 108 to operate in a sequential mode or a parallel mode.

In operation, the clock controllers 108 provide clock pulses at the fast clocks 116 for normal operation of the IC 102 or for the scan testing based on the test mode signal 114-1. For example, the multiplexer 208-2 of the clock controller 108-1 receives the test mode signal 114-1 as a select signal. When the test mode signal 114-1 is at logic low, the multiplexer 208-2 provides the fast clock 116-1 as the FCLK1 115-1 to the associated clock domain 110-1. However, when the test mode signal 114-1 is at logic high, scan testing is performed as described below.

During scan testing, the OR gate 206-2 facilitates in providing capture pulses or shift pulses based on the scan enable signal 114-2. The OR gate 206-2 receives the scan enable signal and an OCS bypass signal 216. The OCS bypass signal 216 is provided to bypass the OCSs 106 and is normally at logic low. In an implementation, when the scan enable signal is high, the shift mode starts. The OR gate 206-2 provides a logic high to the multiplexer 208-1. The multiplexer 208-1 further provides the shift pulses at the slow clock 118 to the multiplexer 208-2. The multiplexer 208-2 provides the shift pulses as the FCLK 115-1 to the associated clock domain 110-1. As mentioned previously, the test pattern 112 can be shifted into test the clock domain 110-1 at the shift pulses.

However, when the scan enable signal 114-2 is low the capture mode starts. The clock controllers 108 sequentially provide the capture pulses to their associated clock domains 110. The operational details for the capture mode are described with reference to certain examples only for better comprehension of the present subject matter. The examples, in no way, should be considered to limit the scope of the present subject matter. In one example, when two capture pulses are required, logic high is stored in both the flip-flops 202-2 and 202-3 by using chain bits 214. The chain bits 214 define the number of capture pulses required in the first clock signal FCLK 115-1 of the clock controller 108-1. In one embodiment, two capture pulses are used, one for launch and the other for capture. However, the number of capture pulses may go up to about 10. The chain bits are stored in the flip-flops based on the slow clock 118.

The scan enable signal 114-2 is captured on an application of the slow clock 118 through the flip-flop 202-1. The scan enable signal 114-2 then traverses through the shift register 210-1 at the fast clock 116-1. In one example, the shift register 210-1 is implemented using six flip-flops (A-F). The first three flip-flops (A, B, C) of the shift register 210-1 are for dealing with meta-stability issues. The next three flip-flops (D, E, F) store logic high.

In the capture mode, the scan enable signal 114-2 is at a logic low, and therefore toggles the fourth flip flop (D) to change its state to a logic low. As a result, the output of the AND gate 204-1 is logic high. Accordingly, an output of the multiplexer 208-2 is logic high, which means that a first capture pulse is provided as the FCLK 115-1 by the first clock controller 108-1 to the first clock domain 110-1. A second capture pulse is also passed through the AND gate 204-2 at the next pulse of the fast clock 116-1. The second capture pulse is also provided to the first clock domain 110-1 as the FCLK 115-1. At a subsequent pulse of the fast clock 116-1, all the flip-flops (A-F) of the shift register 210-1 are toggled to a logic low state.

The shift register 210-1 sends a delayed scan enable signal as the second output signal SCLK 119-1 of the clock controller 108-1. The SCLK 119-1 is transferred to the shift register 124-1. The shift register 124-1 then transfers the SCLK 119-1 to the next controller, i.e., the second clock controller 108-2 through the multiplexer 122-1. In one embodiment, the multiplexer 122-1 is enabled by the sequential capture signal 114-3, thereby pulsing the second clock controller 108-2. When the sequential capture signal 114-3 is logic low, the clock controllers 108 pulse in a parallel manner.

In another embodiment, the value of chain bits 214 may be modified for each of the clock controllers 108 to ensure that at any point in time, no two clock controllers 108 pulse simultaneously.

Figure 3:
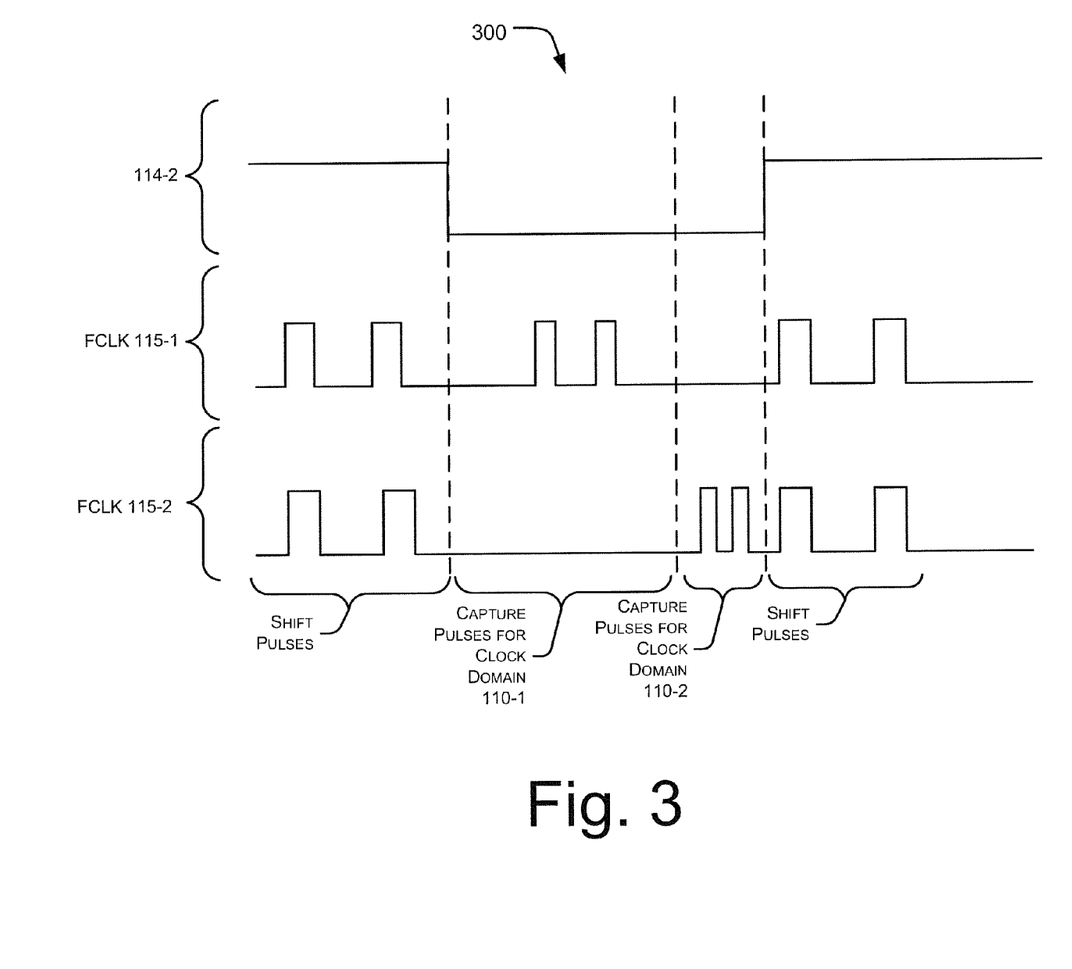
FIG. 3 illustrates waveforms illustrating the working of the clock controllers, according to an embodiment of the present subject matter.

FIG. 3 illustrates the waveforms 300 obtained from the clock controllers 108. For illustration purposes, the FCLKs 115 of the first clock controller 108-1 and the second clock controller 108-2 are shown. The scan enable signal 114-2 is provided by the ATPG system 104 to switch between the capture mode and the shift mode. When the scan enable signal 114-2 is high, the clock controllers 108-1 and 108-2 provide shift pulses at a low frequency, say in the range of 20 MHz. With the shift pulses, the test patterns 112 are loaded in the clock domains 110. However, when the scan enable signal 114-2 is logic low, the clock controllers 108 sequentially provide capture pulses at their respective high frequencies. For example, the clock controller 108-1 provides the capture pulses to its associated clock domain 110-1, and then the clock controller 108-2 provides the capture pulses to test its associated clock domain 110-2. After the capture cycle is complete, the shift pulses are applied for unloading the test patterns 112.

In an implementation, the method of testing the clock domains, in accordance with embodiments of the present subject matter include, provides a scan enable signal to one clock controller in one time frame and then provides another scan enable signal to another clock controller in another time frame such that the two time frames do not overlap. Further, the two clock controllers may be pulsed one after the other using a single pattern.

Figure 4:
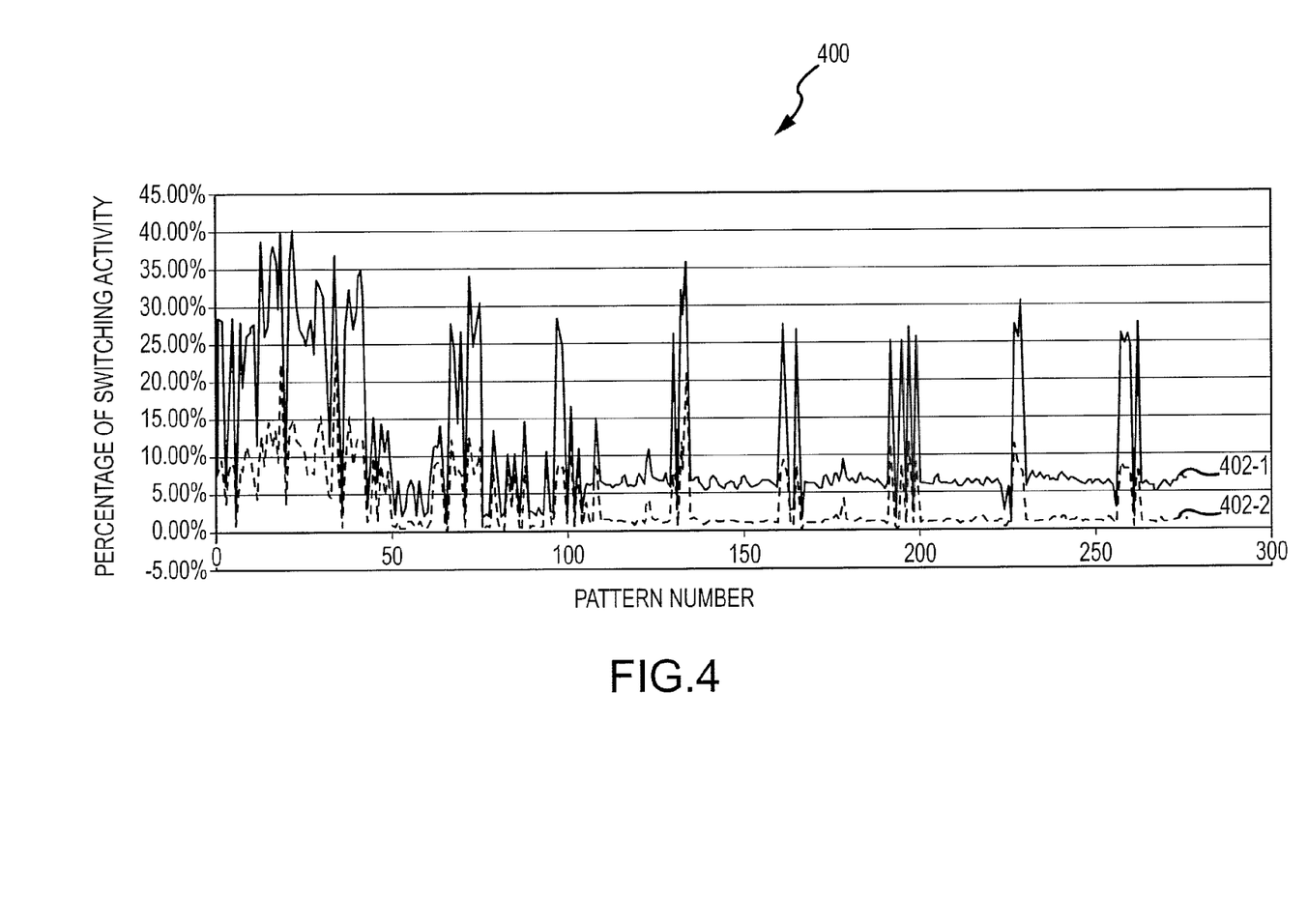
FIG. 4 is a depiction of switching activity when testing the IC, in accordance with an embodiment of the present subject matter.

FIG. 4 illustrates that the switching activity in the capture mode has substantially reduced in the present subject matter. A graph 400 shows that by following the conventional techniques, the ATPG system 104 reports a switching activity 402-1. However, in accordance with the embodiments of the present subject matter, the switching activity 402-2 is substantially reduced as depicted in the figure.

The present subject matter uses a single test pattern to test multiple clock domains by masking the cross clock domain paths. When the cross clock domains paths are not masked, the inter clock domain values in the test pattern are computed based on their shifted values or modified values due to a previously tested clock domain in the cross clock domain. As multiple clock domains can be tested using a single test pattern, the number of test patterns used is reduced. The reduction in the number of test patterns greatly reduces the cost and complexity of the overall system. Also, since the clock controllers can be pulsed one at a time, a timing relationship is defined between two clock controllers. As a result, a power budget can be individually assigned for each clock domain. This means that the number of faults that can be detected in a single clock domain also increases.

In addition, conventionally, ATPG tools divide the power budget amongst clock domains and accordingly, assume a switching activity for each of the clock domain. However, since the clock domains are operating at different clock frequencies, the switching activity is indeed different. By setting up a timing relationship between different controllers, it is now possible for the ATPG system 104 to accurately predict the switching activity.

Figure 5:
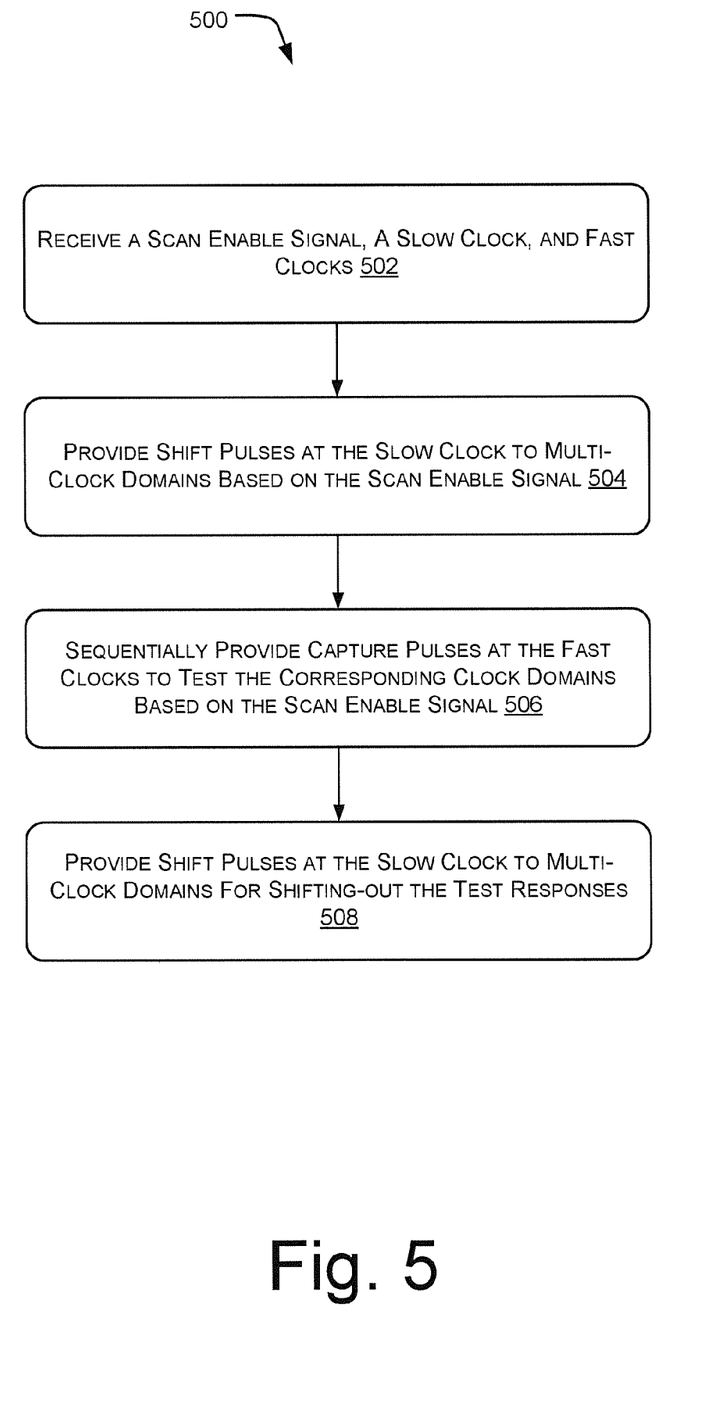
FIG. 5 illustrates a method for testing multiple clock domains in the IC, in accordance with an embodiment of the present subject matter.

FIG. 5 illustrates an exemplary method 500 for testing multi-clock domains, in accordance with an embodiment of the present subject matter. The exemplary method can be described in the general context of an IC. Furthermore, the method can be implemented in any suitable hardware, software, firmware, or combination thereof.

The order in which the method is described is not intended to be construed as a limitation, and any number of the described method blocks can be combined in any order to implement the method, or an alternative method. Additionally, individual blocks may be deleted from the method without departing from the spirit and scope of the subject matter described herein.

At block 502, a scan enable signal, a slow clock, and one or more fast clocks are received. The scan enable signal enables scan testing of the multi-clock domains in a shift mode or the capture mode. For example, when the scan enable signal 114-2 is at a logic high, the shift mode of testing is performed, while when the scan enable signal 114-2 is at logic low, the capture mode of testing is performed.

At block 504, shift pulses at the slow clock are provided to the multi-clock domains based on the scan enable signal. Test patterns for testing the multi-clock domains can be shifted-in at the slow clock. For example, when the scan enable signal 114-2 is logic high, the clock controllers 108 provide shift pulses at the slow clock 118 to the multi-clock domains 110.

At block 506, capture pulses at the fast clocks are provided sequentially to test the corresponding clock domains, based on the scan enable signal. When the scan enable signal is at a logic low, the capture pulses at a first fast clock are provided to a corresponding clock domain. The received test patterns are provided to the corresponding clock domain for testing. Subsequently, the capture pulses at a second fast clock are provided to its corresponding clock domain. This clock domain is similarly tested based on the received test patterns and the capture pulses. For example, the clock controller 108-1 receives the first fast clock 116-1 from the OCS 106-1, and provides capture pulses at the fast clock 116-1 to the associated clock domain 110-1. After the clock controller 108-1 has finished providing the capture pulses to the clock domain 110-1, the second clock controller 108-2 provides the capture pulses at the second fast clock 116-2 to the associated clock domain 110-2.

In an implementation, the scan enable signal is first used to provide capture pulses at the first fast clock to its corresponding clock domain. Then, a delayed scan enable signal provides capture pulses at a second fast clock to the second clock domain, and so on. For example, the delayed scan enable signal from the shift register 210-1 of the clock controller 108-1 is provided to the clock controller 108-2. The delayed scan enable signal enables the clock controller 108-2 to provide capture pulses at second fast clock 116-2 to the associated clock domain 110-2.

At block 508, shift pulses at the slow clock are again provided to the multiple clock domains to shift-out the responses of the multi-clock domains to the received test patterns. As mentioned previously, the shift pulses are provided when the scan enable signal is high. The responses of the multiple clock domains to the test patterns are shifted-out for testing faults present in the multi-clock domains. For example, when the scan enable signal 114-2 is high, the shift pulses at the slow clock 118 are provided to the multiple clock domains 110. The response to the test patterns 112 is captured and analyzed for faults.

Although embodiments for testing of multi-clock domains have been described in language specific to structural features and/or methods, it is to be understood that the invention is not necessarily limited to the specific features or methods described. Rather, the specific features and methods are disclosed as exemplary embodiments for the testing of multi-clock domains.

We claim:

1. A method for testing an integrated circuit (IC), the method comprising:
   providing, based on a scan enable signal, capture pulses at a frequency of a first fast clock to a first clock domain of the IC;
   delaying the scan enable signal by at least a time duration of the capture pulses at the frequency of the first fast clock; and
   providing, based on the delaying, capture pulses at a frequency of a second fast clock to a second clock domain of the IC.

2. The method as claimed in claim 1, further comprising providing a plurality of shift pulses to shift in a test pattern for testing the first clock domain and the second clock domain.

3. The method as claimed in claim 1, wherein providing of shift pulses is performed at a frequency of a slow clock.

4. The method as claimed in claim 1, further comprising masking cross-clock domain paths in the IC.

5. The method as claimed in claim 1, wherein the delaying comprises generating a delayed scan enable signal based on testing the first clock domain.

\* \* \* \* \*